United States Patent [19]
Haraguchi et al.

[11] Patent Number: 5,606,200
[45] Date of Patent: Feb. 25, 1997

[54] RESIN SEALED SEMICONDUCTOR DEVICE WITH IMPROVED STRUCTURAL INTEGRITY

[75] Inventors: Kouichi Haraguchi; Yuji Ichimura, both of Matsumoto City, Japan

[73] Assignee: Fuji Electric Co., Ltd., Japan

[21] Appl. No.: 180,481

[22] Filed: Jan. 12, 1994

[30] Foreign Application Priority Data

Jan. 13, 1993 [JP] Japan .................................. 5-003646
May 6, 1993 [JP] Japan .................................. 5-104849

[51] Int. Cl.⁶ .......................... H01L 23/22; H01L 23/48; H01L 23/04; H01L 23/053
[52] U.S. Cl. ......................... 257/687; 257/690; 257/693; 257/698; 257/700; 257/702; 257/704; 257/788; 361/709
[58] Field of Search ................................. 257/687, 690, 257/693, 698, 701, 702, 704, 730, 792, 788; 361/709

[56] References Cited

U.S. PATENT DOCUMENTS 5,243,217  9/1993  Yamada ................................... 257/692
5,295,044  3/1994  Araki et al. ............................. 361/709

FOREIGN PATENT DOCUMENTS

0501341A1  9/1992  European Pat. Off. ............... 257/687
60-119759  6/1985  Japan .................................... 257/687
60-254350  12/1985 Japan .................................... 257/687
61-148845  7/1986  Japan .................................... 257/687
63-164245  7/1988  Japan .................................... 257/687
4-274350   9/1992  Japan .................................... 257/687

*Primary Examiner*—Steven H. Loke
*Attorney, Agent, or Firm*—Rossi & Associates

[57] ABSTRACT

A resin sealed semiconductor device includes a metallic base plate and a covering case adhered to a peripheral section of the metallic base plate. Semiconductor elements are loaded on the metallic base plate, and lead-out terminals extend from an upper surface of a terminal-supporting plate made to adhere to lead-out terminals. The terminal-supporting plate forms an upper surface of the covering case 5 which is filled with a sealing resin. Uneven stripes are molded and extend circumferentially over the entire outer peripheral surface of terminal-supporting plate to roughen the peripheral surface, and the adhesion strength is reinforced by increasing the adhesive area between the terminal-supporting plate and the sealing resin.

17 Claims, 3 Drawing Sheets

5,606,200

RESIN SEALED SEMICONDUCTOR DEVICE WITH IMPROVED STRUCTURAL INTEGRITY

FIELD OF THE INVENTION

The invention relates generally to a resin sealed semiconductor device. More specifically, the invention relates to configurations for improving the structural integrity of a resin sealed transistor module.

BACKGROUND

FIG. 5 shows an example of a conventional resin sealed semiconductor device assembly configuration. The illustrated configuration includes a metallic base plate 1 that also serves as a heat radiation plate, a semiconductor element 2 loaded or placed on the metallic base plate 1 via a substrate 3. A lead-out terminal 4 is soldered to a surface electrode of the semiconductor element 2 and to a conductor pattern of the substrate 3 and is drawn out and upward. A molded resin covering case 5 is bonded with an adhesive 6 to a peripheral edge of metallic base plate 1, while a molded resin terminal-supporting plate 7, that also serves as the case lid on an upper surface of covering case 5, is held in place by a sealing resin 8 that fills the inside of covering case 5.

Two different types of sealing resin 8 can be used: one is made entirely of epoxy resin; and the other is divided into two layers (upper and lower), wherein the lower layer is made of silicon gel and the upper layer is made of epoxy resin. In the two-layered (upper and lower) sealing resin 8, as the cross-sectional view of the main section in FIG. 6 shows, a step difference 5a is usually prepared on an inner surface of covering case 5, and filling of the inside of covering case 5 with silicon gel 8a starts and stops before the level of silicon gel 8a reaches the step difference 5a. The remaining portion is filled with epoxy resin 8b to harden inside of the covering case 5.

Although the type of-resin material for covering case 5 and terminal-supporting plate 7 are selected in consideration of their resistance to heat, flameproofing property, coloring property, electric characteristics, and molding costs, usually PBT (polybutylene terephthalate) resin or PPS (polyphenylene sulfide) resin are used for covering case 5 and PPS resin for terminal-supporting plate 7.

A problem exists with the conventional resin sealed semiconductor device illustrated in FIG. 5, namely, peeling occurs between the structural components by mutual adhesive failure of the components during actual use or in temperature cycle tests. The peeling further causes trouble such as the degradation of the moisture resistance performance of the device and leaking of the sealing resin (gelatinoid filler) from the covering case. In particular, the adherent surface between the covering case and the sealing resin, and the adherent surface between the terminal-supporting plate and the sealing resin easily peels off.

Further, epoxy resin is used for the sealing resin and solidified at about 135° C. The transition temperature required to solidify epoxy resin into glass is 140°–160° C., and at temperatures below that range the elasticity of the hardened epoxy resin is highly stable at approximately 1,200 kg/mm². The glass transition temperature for PPS resin is 80°–90° C., and although at temperatures below this range the elasticity of PPS resin is very stable at approximately about 1,800 kg/mm², at temperatures above this range the elasticity of the PPS resin tends to gradually decrease. Accordingly, when a covering case and terminal-supporting plate made of PPS resin, in order to fill the inside of the covering case and solidify the PPS resin at about 135° C., since the elasticity of the PPS resin, which decreases somewhat, does not change considerably, a difference in the elasticity of the PPS resin and the epoxy resins arises, causing further latent stress in the adherent surface between the covering case and the sealing resin, and between the terminal-supporting plate and the sealing resin.

Since an external mechanical stress such as high tension or bending load is applied to said adherent surfaces during connection of the external wiring to lead-out terminals, peeling occurs between the terminal-supporting plate, which supports the lead-out terminals, and the sealing resin, and further between the covering case and the sealing resin. When the lead-out terminal comes loose due to the peeling thus caused, stress is also applied to the soldered sections between the lead-out terminals and the semiconductor device, thereby causing serious defects such as damage to the semiconductor device.

Furthermore, when an attempt is made to use an adhesive to solidify the adhesive used to bond the metallic base plate to the external covering case, the adhesive runs out of the adherent section and then out from under the lower surface of the metallic base plate and adheres thereto, thereby damaging the smoothness of the mounting surface, reducing the adhesiveness of the semiconductor device to an apparatus, degrading the heat radiation performance of the semiconductor device, or causing the adhesive to further run into the screw holes prepared on the metallic base plate for mounting the semiconductor device, thereby disabling the mounting of the semiconductor device, or loosening the screws in use.

Given the above situation, the object of the present invention is to provide a stiff and highly reliable resin sealed semiconductor device by resolving said problems, and by preventing the adhesive between structural components to lose its adhesive properties.

SUMMARY OF THE INVENTION

In order to achieve the aforementioned objects, the outer peripheral surface of a terminal-supporting plate, connected to lead-out terminals in a semiconductor device of the present invention, is unevenly finished. The uneven finish can be achieved by forming radial uneven stripes over the entire peripheral surface of the terminal-supporting plate to roughen said surface. Further improvements are achieved by roughening or unevenly finishing the interface between a covering case and a metallic base plate.

Also, in a further embodiment, an outer peripheral surface of the terminal-supporting plate is inclined upward, while a surface of the covering case facing the inclined outer peripheral surface is inclined downward. In addition, by unevenly finishing either one of the inclined outer peripheral surface of the terminal-supporting plate and the inclined surface of the covering case facing the inclined outer peripheral surface, further advantages can be achieved most effectively.

Moreover, by forming a configuration such that a first groove is prepared in a peripheral section of an upper surface of the metallic base plate, and a second groove is prepared in an end face of a lower section of the covering case in such a way as to be deeper than the first groove, to be wider than the thickness of the outer wall of the first groove, and to have its inner wall thinner than the width of the first groove, the metallic base plate and the covering case are made to adhere to each other using adhesive with the inner wall of the second groove fitted into the first groove and the outer wall of the first groove fitted into the second groove, the adhesive used to bond the metallic base plate and the covering case can be prevented from leaking, and the adhesive will bond the components securely. In this case, adhesion can be made more effective by roughening the outer surface of the inner wall of the second groove.

Furthermore, either the terminal-supporting plate or the covering case are preferably made of PPS resin, wherein at least one of the following groups is incorporated in at least part of an addition group or terminal group of a molecular design:

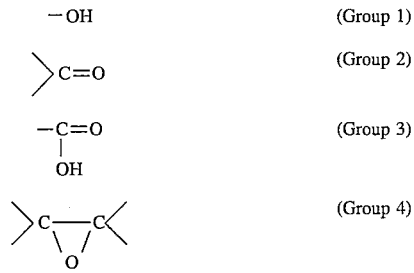

In the configuration of the invention, when the outer peripheral surface of the terminal-supporting plate or the inner wall surface of the covering case that adheres to the sealing resin, or the surface that adheres to the adhesive for the covering case is unevenly finished, due to the anchoring effect created by the sealing resin and the adhesive running into the uneven section to bond the structural components, as well as the increase in adhesive area between the sealing resin, the adhesive, and each of structural components, high adhesive strength and stiffness can be obtained. In particular, roughening the outer peripheral surface of the terminal-supporting plate can easily protect the sealing resin from peeling away from the terminal-supporting plate, even when a large external force (e.g., load screw) is applied to the lead-out terminal, thereby enhancing the reliability of the semiconductor device.

By inclining the outer peripheral surface of the terminal-supporting plate upward and the surface of the covering case that faces said peripheral surface downward, when external force is applied to the terminal-supporting plate, the anchoring effect by inclination acts, thereby protecting the terminal-supporting plate from slipping off. In this case, since roughening or unevenly finishing the inclined surface heightens the aforementioned effect, a preferred result can be expected.

By forming a configuration such that the first groove is prepared in the peripheral section of the upper surface of the metallic base plate, and the second groove is prepared in the end face of the lower section of the covering case in such a way as to be deeper than the first groove, to be wider than the thickness of the outer wall of the first groove, and to have its inner wall thinner than the width of the first groove, and such that the metallic base plate and the covering case are made to adhere to each other using adhesive with the inner wall of the second groove fitted into the first groove and the outer wall of the first groove fitted into second groove B, the metallic base plate and the covering case can be made to adhere to each other with a wide interface, and with both the metallic base plate and the covering case interfitted with each other at the interface, thereby facilitating very strong bonding. Furthermore, since the second groove is deeper than the first groove, a surplus quantity of adhesive remains in the bottom of the second groove, thereby enabling enhanced adhesion, and preventing the adhesive from running out of the adhered section.

Further, in this invention, either the terminal-supporting plate or the covering case is molded with PPS, and at least one of the above-mentioned groups is laid out so that it is combined with either part of the addition group or terminal group of the molecular design as described above.

Since, in said PPS resin, the negative hydroxyl —OH group, for example, causes molecular bonding with a free group of the same kind with the aid of hydrogen bonding, relatively strong bonding, which although weaker than chemical bonding is still stronger than two surfaces merely contacting, results between either the terminal-supporting plate or the covering case and the sealing resin. Accordingly, the sealing resin and either the terminal-supporting plate or the covering case can flexibly deal with the strain of the sealing resin in the hardening process, thereby suppressing the terminal-supporting plate from peeling off from and the covering case when an external force is applied to the terminal-supporting plate.

BRIEF DESCRIPTION OF THE DRAWINGS

FIGS. 1(a) and 1(b) show a first embodiment of the present invention, wherein FIG. 1(a) is a sectional view and FIG. 1(b) is a partial external view of the terminal-supporting plate shown in FIG. 1(a).

FIGS. 7(a) and 7(b) are diagrams showing the molecular structure of PPS resin, wherein FIG. 7(a) shows the structure of an ordinary PPS polymer and FIG. 7(b) shows the structure of the PPS polymer related to this invention.

DETAILED DESCRIPTION OF PREFERRED EMBODIMENT

Figure 5:
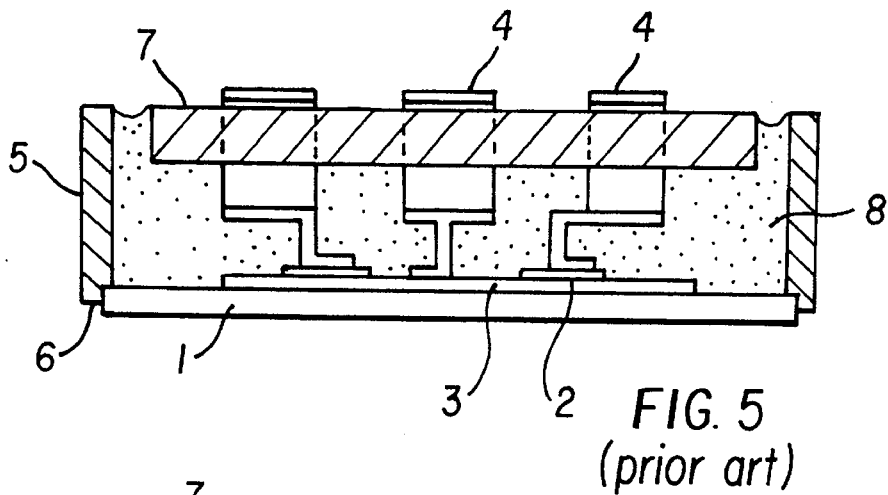
FIG. 5 is a sectional view of a conventional resin sealed semiconductor device.
Figure 6:
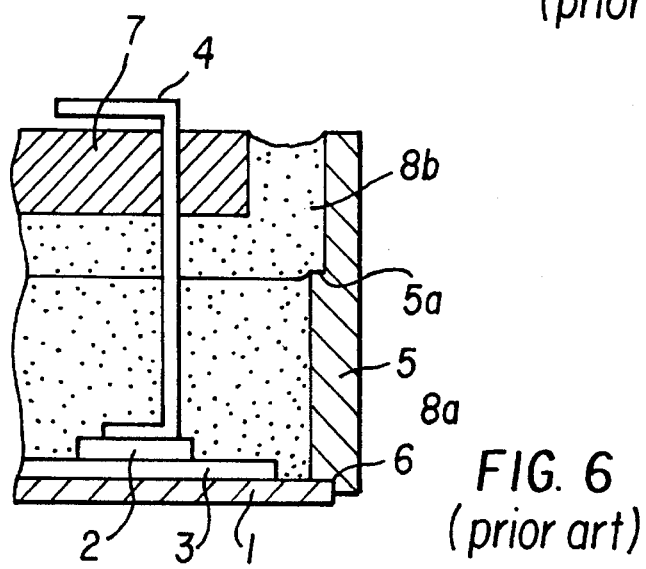
FIG. 6 is a sectional view of a conventional resin sealed semiconductor device.

In reference to the attached drawings, the exemplary embodiment of this invention is explained below in reference to the attached drawings of an example embodiment, in which the same components that corresponds to FIGS. 5 and 6 are designated by the same reference number.

Figure 1A:
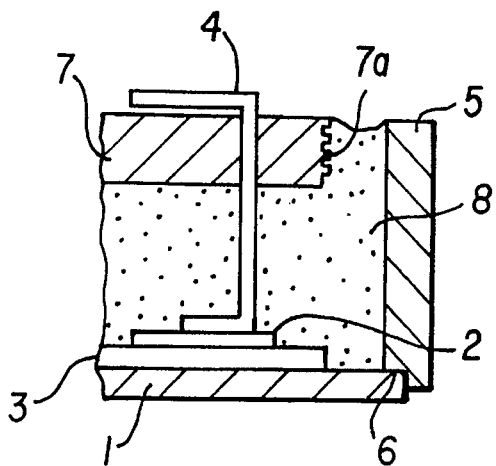
Figure 1B:
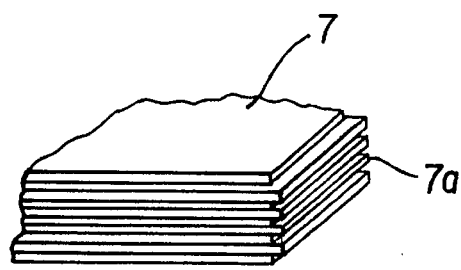

FIGS. 1(a) and 1(b) shows an example embodiment of this invention, wherein FIG. 1(a) is a sectional view of the embodiment, and FIG. 1(b) is a partial external view of the terminal-supporting plate shown in FIG. 1(a). FIG. 1(b) shows radial stripes 7a molded on the outer peripheral surface of terminal-supporting plate 7, which is connected to lead-out terminal 4, whereby the peripheral surface is roughened or unevenly finished. These uneven stripes 7a are molded together with the terminal-supporting plate or by slitting said plate.

In the above configuration, since sealing resin 8, with which the inside of covering case 5 is filled, runs between uneven stripes 7a and hardens, the increase in the adhesive area and the anchoring effect by uneven stripes 7a results in a high adhesive strength between terminal-supporting plate 7 and sealing resin 8. Accordingly, even when a large external force (e.g., tension; bending load) is applied to lead-out terminal 4 during actual operation, the binding surface is no longer likely to peel off easily from terminal-supporting plate or sealing resin 8.

Figure 2:
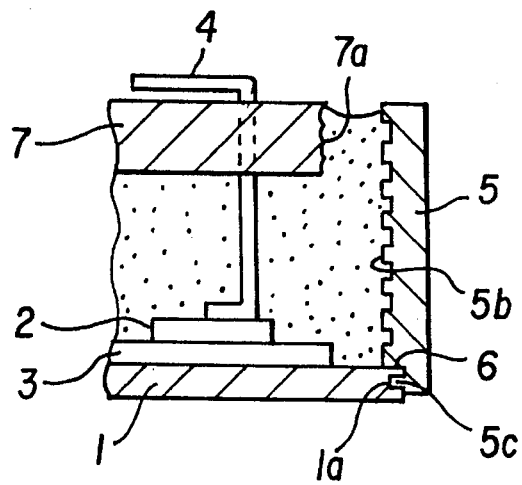
FIG. 2 is a sectional view showing a second embodiment of the invention.

FIG. 2 is a sectional view of the subject matter showing an example embodiment that is a further development of the diagram in FIG. 1(a), in which the uneven stripes 7a were molded onto the outer peripheral surface of terminal-supporting plate 7 to roughen its surface. In this embodiment, many uneven stripes 5b are molded onto the inner wall of covering case 5 to roughen or unevenly form the inner wall and uneven step sections 1a and 5c are formed in the metallic base plate 1 and covering case 5, respectively, which are bonded by adhesive 6. With the above configuration, both the adhesive strength between covering case 5 and sealing resin 8, and that between metallic base plate 1 and covering case 5 are enhanced, thereby increasing the adhesive strength of the entire resin sealing semiconductor device. Roughening both the outer peripheral surface of terminal-supporting plate 7 and the inner wall of covering case 5 to obtain an uneven surface may be done using sandpaper or a cutting device of sufficiently hardness compared with that of the resin to cut or scratch the outer peripheral surface of terminal-supporting plate 7 and the inner wall of covering case 5 after molding. In this case, since the cutting or scratching that is done after terminal-supporting plate 7 and covering case 5 are molded also removes the mold lubricant present on their surfaces, the molding resin and the sealing resin directly touch, thereby further enhancing adhesion.

Figure 3:
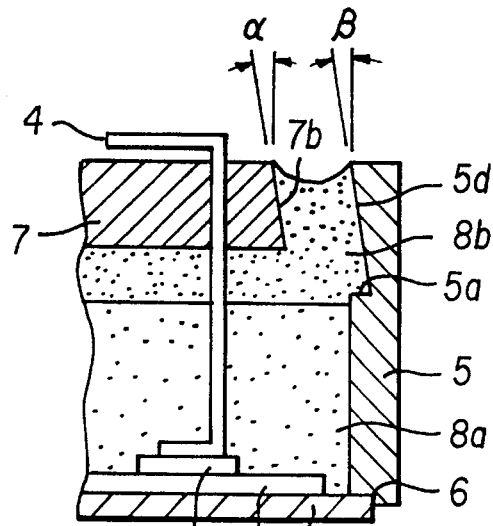
FIG. 3 is a sectional view showing a third embodiment of the invention.

FIG. 3 is a sectional view of the subject matter showing a different example embodiment of this invention, in which the outer peripheral surface of terminal-supporting plate 7 is made to incline upward and the inclined surface is inclined face 7b where the angle $\alpha$ of the contact surface between the outer peripheral surface of terminal-supporting plate 7 and sealing resin 8 is greater than 0°, and the surface of covering case 5 facing inclined face 7b is made to incline downward and the inclined surface is inclined face 5d where the angle $\beta$ of the contact surface between the surface of covering case 5 facing inclined face 7b and sealing resin 8 is greater than 0°. Inclining the contact surface between the outer peripheral surface of terminal-supporting plate 7 and sealing resin 8 and the contact surface between the surface of covering case 5, facing the former inclined surface, and sealing resin 8 will prevent terminal-supporting plate 7 from slipping when an external force is applied to lead-out terminal 4. Although such an effect can be obtained also by inclining only the outer peripheral surface of terminal-supporting plate 7, also inclining the surface of covering case 5, facing the slanting surface, further enhances the effect of protecting terminal-supporting plate 7 from slipping. The above inclination can be achieved by changing the molding die or by cutting after molding. Furthermore, unevenly finishing these slanting surfaces is the most preferred method to obtain the aforementioned roughening effect.

Figure 4A:
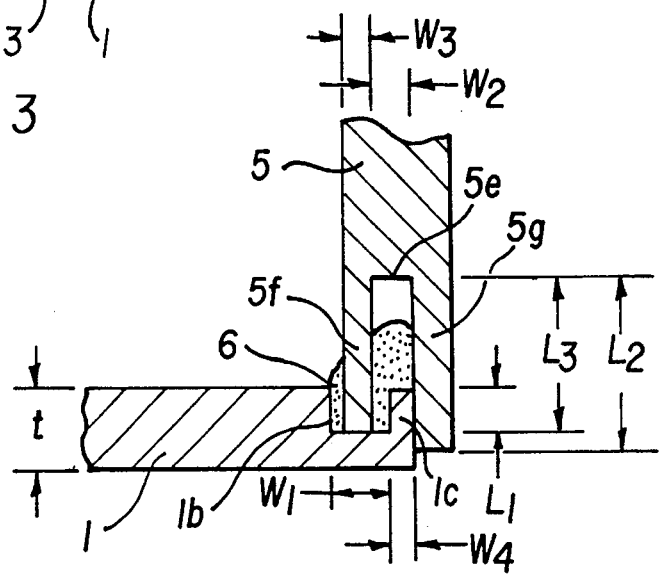
FIGS. 4(a)–4(c) are sectional views showing a fourth embodiment of the invention.
Figure 4B:
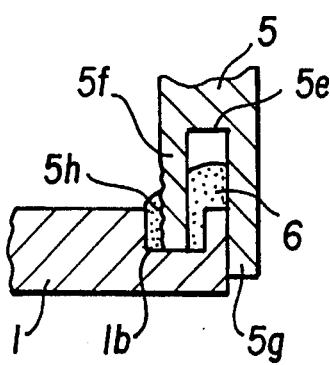
Figure 4C:
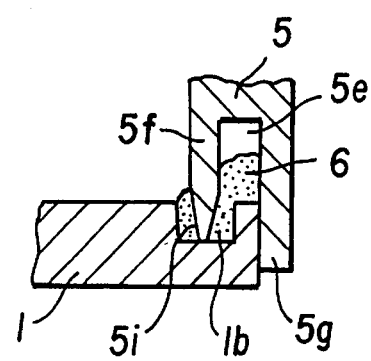

FIGS. 4(a)–(c) are enlarged sectional views showing another example embodiment of the invention, in which a groove is formed in the section adhered to metallic base plate 1 and in the section adhered to cover case 5, and these grooves are fitted into each other to securely adhere these sections, and in which each of FIGS. 4(a), 4(b), and 4(c) show examples of a different configurations.

In FIG. 4(a), reference number 1b is a first groove of width $W_1$ and depth $L_1$ prepared in the peripheral section of metallic base plate 1; reference number 5e is a second groove of width $W_2$ and depth $L_2$ prepared in the end face of covering case 5, reference number 1c is an outer wall forming groove 1b, and reference numbers 5f and 5g are the inner wall and outer wall of groove 5e. In terms of physical dimensions, the relationship between height $L_3$ and width $W_3$ of inner wall 5f of groove 5e, and depth $L_1$ and width $W_1$ of groove 1b is $L_3 >_{L1}$ and $W_3 < W_1$, respectively. The relationship between the height of outer wall 5g of groove 5e or depth $L_2$ of groove 5e and $L_3$ is $L_2 > L_3$. Therefore, if the thickness of the metallic base plate is t the relationship between $L_2$, $L_3$, t, and $L_1$ can be defined as $L_2 < L_3 + t - L_1$, and the relationship between width $W_4$ of outer wall 1c of groove 1b and width $W_2$ of groove 1b is $W_4 < W_2$. Accordingly, when adhering metallic base plate 1 to covering case 5, the tip of inner wall 5f can be fitted into groove 1b, and outer wall 1c can be fitted into groove 5e so as to interfit grooves 1b and 5e. Then, the tip of inner wall 5f butts against the bottom of groove 1b to form the vertical supporting section of covering case 5, and the tip of outer wall 5g is below the upper surface of metallic base plate 1. Furthermore, a cavity exists in the bottom section of groove 5e. When filling groove 1b with adhesive 6 and adhering metallic base plate 1 to covering case 5 with grooves 1b and 5e interfitted with each other as stated above, they are made to adhere to each other over a wide adhesive area, and furthermore, since both grooves are interfitted with each other, metallic base plate 1 and covering case 5 will adhere strongly. In addition, since any surplus adhesive will remain in the cavity in the bottom section of groove 5e, the adhesive will not run outside the adhered section, nor for example, reach the lower surface of metallic base plate 1, obstruct adhesion of the semiconductor device to an apparatus, and degrade the heat radiation of the device.

FIG. 4(b) is an example of a configuration where outer surface 5h of inner wall 5f of groove 5e of covering case 5e is roughened to further strengthen adhesion as compared to the configuration of FIG. 4(a), and FIG. 4(c) is an example of a configuration where the top section of groove 5e of the covering case is formed into taper 5i so that the adhesion area can be widened to enhance the adhesive strength and also make mold lubrication easier when molding covering case 5.

In addition to the structural configurations illustrated above, either the terminal-supporting plate or the covering case are preferably made of straight-chain PPS resin, molded using PPS resin of molecular structure containing at least one of the following groups is incorporated in at least part of an addition group or terminal group of a molecular design:

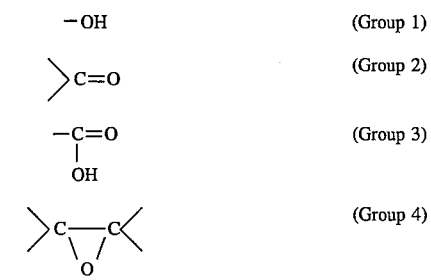

| | |
|---|---|
| $-OH$ | (Group 1) |
| $\!\!>\!\!C\!=\!O$ | (Group 2) |
| $\begin{array}{c}-C=O\\|\\OH\end{array}$ | (Group 3) |
| $\!\!>\!\!C\!\!-\!\!-\!\!C\!\!<\!\!\!\!\!\!\!\!\!\!\!\!\!\diagdown\!\!O\!\diagup$ | (Group 4) |

Straight-chain PPS resin is a polycondensation of dichlorobenzene chemical formula

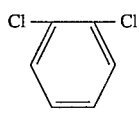

and sodium sulfide (Na—S—Na), which produces PPS with high molecular weight and which cleans the PPS with high molecular weight to remove impurity product NaCl therefrom. Then, one of the aforementioned groups, for example the negative hydroxyl —OH group, is introduced or added to the addition group or terminal group of a molecular design to produce a PPS resin containing these groups. Furthermore, during polycondensation, it is effective to mix these groups together with an additive. It is also effective to use ordinary PPS resin to mold the terminal-supporting plate and the covering case, and then apply an ultraviolet ray of wavelength 185 nm or 254 nm to the contact surfaces between the terminal-supporting covering case, and sealing resin, or to apply plasma thereto to generate a radical on the surface.

Figure 7A:
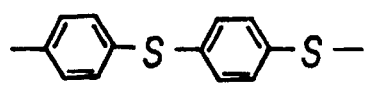
Figure 7B:
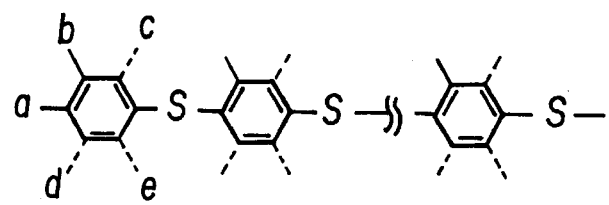

FIGS. 7(a) and (b) are diagrams of the molecular structure of PPS, wherein FIG. 7(a) is the molecular structure of an ordinary PPS polymer, and FIG. 7(b) is the molecular structure of the PPS resin relating to this invention, wherein the chain of the structure shown in FIG. 7(a) is cut at the middle, and wherein a molecular structure having one of the groups listed above is added to part of a and b, c, d, and e of a benzene ring.

As mentioned above, by forming straight-chain PPS that contains —OH or similar group, heat resistance (260° C.), flame resistance (the self-quenching property of PPS resin is industrially advantageous), and range of colors (black; green; white), which are the main characteristics of straight-chain PPS resin, an effect can be obtained that the -OH group or the like is connected as sealing resin by means of hydrogen bonding (X—H . . . Y or X . . . H—Y) to the same group of epoxy resin, that PPS resin and epoxy resin are bonded at a molecular level, and that adhesion of the terminal-supporting plate to the covering case becomes stronger.

Furthermore, adding fiberglass or silica ($SiO_2$) to the above PPS resin is preferable for enhancing the mechanical strength of the resin and the adhesion of PPS resin to epoxy resin.

Although the aforementioned has been described separately for the covering case and the terminal-supporting plate, making PPS resin that contains the —OH group is effective even for a monolithic mold of the covering case and the terminal-supporting plate.

In accordance with the characteristics mentioned above, this invention has the following beneficial effects:

(a) since the contact surface between the outer peripheral surface and the sealing, and the adherent surface between the covering case and the metallic base plate are unevenly finished, the adhesion of each joint section is strengthened and made rigid, thereby improving the durability and reliability of the resin sealing semiconductor device;

(b) since the outer peripheral surface of the terminal-supporting plate is inclined upward and the surface of the covering case facing the upward inclined surface is inclined downward, slipping off of the terminal-supporting plate when an external force is applied to the lead-out terminal can be prevented, and when either one of the inclined outer surface of the terminal-supporting plate or the inclined surface of the covering case facing the inclined outer surface is unevenly finished, the roughness strengthens the adhesion;

(c) when a first groove is prepared on the peripheral section of the upper surface of the metallic base plate, and a second groove, deeper than the first groove, wider than the thickness of the outer wall of first groove, and having an inner wall that is thinner than the first groove, is prepared on the lower end face of the covering case, and the metallic base plate and the covering case are made to adhere to each other using adhesive with the inner wall of second groove fitted into the first groove, and with the outer wall of first groove fitted into the second groove, the metallic base plate and the covering case are made to adhere to each other very strongly, and, in addition, since adhesive may remain in the cavity at the bottom of second groove, running of the adhesive outside the adhesive section and reaching the lower surface of the metallic base plate can be prevented, and prevents the resin sealed semiconductor device from adhering to an apparatus, which eventually degrading the heat radiation, and the roughening of the outer surface of the inner wall of the second groove further increases the preferred results; and (d) by molding either the terminal-supporting plate or the covering case with PPS resin prepared by combining an —OH group or the like with part of either the addition group or terminal group of a molecular design, bonding at molecular level is further added to the adhesion of the terminal-supporting plate or the covering case and sealing resin, thereby improving the strength of the adhesion.

The invention has been described with reference to certain preferred embodiments thereof. It will be understood, however, that modifications and variations are possible within the scope of the appended claims.

What is claimed is:

1. A resin sealed semiconductor device comprising:
a metallic base plate; a covering case attached to the periphery of the metallic plate at an interface; a semiconductor element fixed on the metallic plate; at least one lead-out terminal connected to a surface electrode on the semiconductor element; and a terminal-supporting plate for supporting the lead-out terminal;
wherein the terminal-supporting-plate has an outer peripheral surface that is roughened across its entire face and a space between the outer peripheral surface of the terminal-supporting plate and the covering case is filled with a sealing resin.

2. A resin sealed semiconductor device as claimed in claim 1, wherein uneven stripes extend circumferentially over the entire outer peripheral surface of the terminal-supporting plate to roughen said peripheral surface.

3. A resin sealed semiconductor device as claimed in claim 1, wherein an inner wall surface of the covering case is also roughened.

4. A resin sealed semiconductor device as claimed in claim 1, wherein one of the terminal-supporting plate and the covering case comprises a polyphenylene sulfide resin including at least one of the following groups

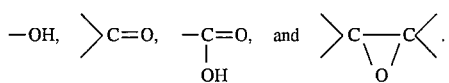

5. A resin sealed semiconductor device comprising:

a metallic base plate; a covering case attached to the periphery of the metallic plate at an interface; a semiconductor element fixed on the metallic plate; at least one lead-out terminal connected to a surface electrode on the semiconductor element; and a terminal-supporting plate for supporting the lead-out terminal;

wherein an outer peripheral surface of said terminal-supporting plate is an inclined outer peripheral surface and a surface of the covering case facing the peripheral surface is an inclined surface, and a space between the outer peripheral surface of the terminal-supporting plate and the covering case is filled with a sealing resin.

6. A resin sealed semiconductor device as claimed in claim 5, wherein at least one of the inclined outer peripheral surface of the terminal-supporting plate and the inclined surface of the covering case facing the inclined outer peripheral surface are roughened.

7. A resin sealed semiconductor device as claimed in claim 5, wherein a first groove is prepared on a periphery of an upper surface of the metallic base plate, and wherein a second groove, having a depth exceeding that of the first groove, a width greater than the thickness of the outer wall of the first groove, and an inner wall thickness less than the width of the first groove, is prepared on an end face of a lower section of the covering case, and wherein the metallic base plate and the covering case are made to adhere to each other with the inner wall of the second groove fitted into the first groove, and with the outer wall of the first groove fitted into the second groove.

8. A resin sealed semiconductor device as claimed in claim 7, wherein an outer surface of an inner wall of the second groove is roughened.

9. A resin sealed semiconductor device as claimed in claim 5, wherein one of the terminal-supporting plate and the covering case comprises a polyphenylene sulfide resin including at least one of the following groups

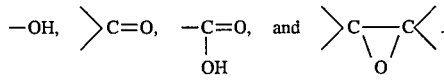

10. A resin sealed semiconductor device comprising:

a metallic base plate; a covering case attached to the periphery of the metallic plate at an interface; a semiconductor element fixed on the metallic plate; at least one lead-out terminal connected to a surface electrode on the semiconductor element; and a terminal-supporting plate for supporting the lead-out terminal;

wherein the terminal-supporting plate has an outer peripheral surface that is roughened and a space between the outer peripheral surface of the terminal-supporting plate and the covering case is filled with a sealing resin; and wherein a first groove is prepared on a periphery of an upper surface of the metallic base plate, and wherein a second groove, having a depth exceeding that of the first groove, a width greater than the thickness of the outer wall of the first groove, and an inner wall thickness less than the width of the first groove, is prepared on an end face of a lower section of the covering case, and wherein the metallic base plate and the covering case are made to adhere to each other with the inner wall of the second groove fitted into the first groove, and with the outer wall of the first groove fitted into the second groove.

11. A resin sealed semiconductor device as claimed in claim 10, wherein an outer surface of an inner wall of the second groove is roughened.

12. A resin sealed semiconductor device comprising:

a metallic base plate; a covering case attached to the periphery of the metallic plate at an interface; a semiconductor element fixed on the metallic plate; at least one lead-out terminal connected to a surface electrode on the semiconductor element; and a terminal-supporting plate for supporting the lead-out terminal;

wherein the terminal-supporting plate has an outer peripheral surface that is roughened and a space between the outer peripheral surface of the terminal-supporting plate and the covering case is filled with a sealing resin;

wherein an inner wall surface of the covering case is also roughened; and wherein a first groove is prepared on a periphery of an upper surface of the metallic base plate, and wherein a second groove, having a depth exceeding that of the first groove, a width greater than the thickness of the outer wall of the first groove, and an inner wall thickness less than the width of the first groove, is prepared on an end face of a lower section of the covering case, and wherein the metallic base plate and the covering case are made to adhere to each other with the inner wall of the second groove fitted into the first groove, and with the outer wall of the first groove fitted into the second groove.

13. A resin sealed semiconductor device as claimed in claim 12, wherein an outer surface of an inner wall of the second groove is roughened.

14. A resin sealed semiconductor device comprising:

a metallic base plate; a covering case attached to the periphery of the metallic plate at an interface; a semiconductor element fixed on the metallic plate;at least one lead-out terminal connected to a surface electrode on the semiconductor element; and a terminal-supporting plate for supporting the lead-out terminal;

wherein the terminal-supporting plate has an outer peripheral side surface, located between an upper surface and a lower surface of the terminal-supporting plate, that is roughened and a space between the outer peripheral side surface of the terminal-supporting plate and the covering case is filled with a sealing resin;

wherein a first groove is prepared on a periphery of an upper surface of the metallic base plate, and wherein a second groove, having a depth exceeding that of the first groove, a width greater than the thickness of the outer wall of the first groove, and an inner wall thickness less than the width of the first groove, is prepared on an end face of a lower section of the covering case, and wherein the metallic base plate and the covering case are made to adhere to each other with the inner wall of the second groove fitted into the first groove, and with the outer wall of the first groove fitted into the second groove; and wherein at least a surface of the inner wall of the second groove and a surface of the metallic base plate are roughened.

15. A resin sealed semiconductor device as claimed in claim 14, wherein an outer surface of an inner wall of the second groove is roughened.

16. A resin sealed semiconductor device comprising:

a metallic base plate; a covering case attached to the periphery of the metallic plate at an interface; a semiconductor element fixed on the metallic plate; at least one lead-out terminal connected to a surface electrode on the semiconductor element; and a terminal-supporting plate for supporting the lead-out terminal;

wherein the terminal supporting plate has an outer peripheral side surface, located between an upper surface and a lower surface of the terminal-supporting plate, that is roughened and a space between the outer peripheral side surface of the terminal-supporting plate and the covering case is filled with a sealing resin;

wherein one of the terminal-supporting plate and the covering case comprises a polyphenylene sulfide resin; and wherein the polyphenylene sulfide resin includes at least one of the following groups:

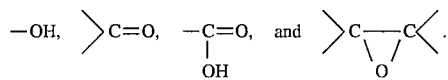

17. A resin sealed semiconductor device comprising:

a metallic base plate; a covering case attached to the periphery of the metallic plate at an interface; a semiconductor element fixed on the metallic plate; at least one lead-out terminal connected to a surface electrode on the semiconductor element; and a terminal-supporting plate for supporting the lead-out terminal;

wherein the terminal-supporting plate has an outer peripheral surface that is roughened and a space between the outer peripheral surface of the terminal-supporting plate and the covering case is filled with a sealing resin;

wherein an inner wall surface of the covering case is also roughened; and wherein one of the terminal-supporting plate and the covering case comprises a polyphenylene sulfide resin including at least one of the following groups:

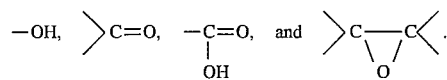

* * * * *